(12) United States Patent
Shmukler et al.

(10) Patent No.: US 8,303,349 B2
(45) Date of Patent: Nov. 6, 2012

(54) DUAL COMPRESSIVE CONNECTOR

(75) Inventors: Vadim Shmukler, Rishon-Lezion (IL); Israel Gershman, Yahud (IL)

(73) Assignee: Solaredge Technologies Ltd., Hod Hasharon (IL)

( * ) Notice: Subject to any disclaimer, the term of this patent is extended or adjusted under 35 U.S.C. 154(b) by 0 days.

(21) Appl. No.: 12/785,801

(22) Filed: May 24, 2010

(65) Prior Publication Data

US 2010/0297860 A1    Nov. 25, 2010

Related U.S. Application Data

(60) Provisional application No. 61/180,458, filed on May 22, 2009.

(51) Int. Cl.
*H01R 11/09*    (2006.01)
(52) U.S. Cl. ...................................................... 439/724
(58) Field of Classification Search ................ 439/439, 439/786–788, 835, 724
See application file for complete search history.

(56) References Cited

U.S. PATENT DOCUMENTS

| | | | |
|---|---|---|---|
| 3,369,210 A * | 2/1968 | Menickella | 439/32 |
| 3,596,229 A * | 7/1971 | Hohorst | 439/592 |
| 4,171,861 A * | 10/1979 | Hohorst | 439/94 |
| 4,452,867 A | 6/1984 | Conforti | |
| 4,460,232 A | 7/1984 | Sotolongo | |
| 4,623,753 A | 11/1986 | Feldman et al. | |
| 4,637,677 A * | 1/1987 | Barkus | 439/724 |
| 4,641,079 A | 2/1987 | Kato et al. | |
| 4,783,728 A | 11/1988 | Hoffman | |
| 4,903,851 A | 2/1990 | Slough | |
| 4,987,360 A | 1/1991 | Thompson | |
| 5,045,988 A | 9/1991 | Gritter et al. | |
| 5,280,232 A | 1/1994 | Kohl et al. | |

(Continued)

FOREIGN PATENT DOCUMENTS

EP    0420295    4/1991

(Continued)

OTHER PUBLICATIONS

International Search Report for PCT/IB2007/004610 dated Feb. 23, 2009.

(Continued)

*Primary Examiner* — Renee S Luebke
*Assistant Examiner* — Larisa Tsukerman
(74) *Attorney, Agent, or Firm* — Banner & Witcoff, Ltd.

(57) ABSTRACT

An electrical connector for electrically connecting multiple photovoltaic bus bars. A casing includes first and second opposing walls. An elastic strip is bent into a bent elastic strip with a first leg and a second leg. The bent elastic strip is disposed between the first and second walls of the casing with the first leg pressing against the first wall and the second leg pressing against the second wall. The bent elastic strip is configured to hold at least one of the photovoltaic bus bars between the first leg and the first wall and another of the photovoltaic bus bars between the second leg and the second wall. The bent elastic strip may be formed of resilient spring metal with a thickness and an elastic modulus. The thickness and/or the elastic modulus of the elastic strip is/are configured so that the bus bars are inserted without requiring a tool to open a space and so that the bus bars are removed from the connector without requiring a tool to break the electrical connection.

10 Claims, 6 Drawing Sheets

U.S. PATENT DOCUMENTS

| | | | |
|---|---|---|---|
| 5,460,546 A * | 10/1995 | Kunishi et al. ............. 439/631 | |
| 5,497,289 A | 3/1996 | Sugishima et al. | |
| 5,548,504 A | 8/1996 | Takehara | |
| 5,604,430 A | 2/1997 | Decker et al. | |
| 5,646,501 A | 7/1997 | Fishman et al. | |
| 5,773,963 A | 6/1998 | Blanc et al. | |
| 5,780,092 A | 7/1998 | Agbo et al. | |
| 5,798,631 A | 8/1998 | Spee et al. | |
| 5,801,519 A | 9/1998 | Midya et al. | |
| 5,804,894 A | 9/1998 | Leeson et al. | |
| 5,821,734 A | 10/1998 | Faulk | |
| 5,822,186 A | 10/1998 | Bull et al. | |
| 5,838,148 A | 11/1998 | Kurokami et al. | |
| 5,869,956 A | 2/1999 | Nagao et al. | |
| 5,873,738 A | 2/1999 | Shimada et al. | |
| 5,892,354 A | 4/1999 | Nagao et al. | |
| 5,923,158 A | 7/1999 | Kurokami et al. | |
| 5,945,806 A | 8/1999 | Faulk | |
| 5,963,010 A | 10/1999 | Hayashi et al. | |
| 5,990,659 A | 11/1999 | Frannhagen | |
| 6,031,736 A | 2/2000 | Takehara et al. | |
| 6,046,919 A | 4/2000 | Madenokouji et al. | |
| 6,050,779 A | 4/2000 | Nagao et al. | |
| 6,082,122 A | 7/2000 | Madenokouji et al. | |
| 6,105,317 A | 8/2000 | Tomiuchi et al. | |
| 6,111,188 A | 8/2000 | Kurokami et al. | |
| 6,111,391 A | 8/2000 | Cullen | |
| 6,111,767 A | 8/2000 | Handleman | |
| 6,163,086 A | 12/2000 | Choo | |
| 6,166,455 A | 12/2000 | Li | |
| 6,166,527 A | 12/2000 | Dwelley et al. | |
| 6,169,678 B1 | 1/2001 | Kondo et al. | |
| 6,259,234 B1 | 7/2001 | Perol | |
| 6,262,558 B1 | 7/2001 | Weinberg | |
| 6,285,572 B1 | 9/2001 | Onizuka et al. | |
| 6,320,769 B2 | 11/2001 | Kurokami et al. | |
| 6,339,538 B1 | 1/2002 | Handleman | |
| 6,493,246 B2 | 12/2002 | Suzui et al. | |
| 6,531,848 B1 | 3/2003 | Chitsazan et al. | |
| 6,545,211 B1 | 4/2003 | Mimura | |
| 6,548,205 B2 | 4/2003 | Leung et al. | |
| 6,590,793 B1 | 7/2003 | Nagao et al. | |
| 6,608,468 B2 | 8/2003 | Nagase | |
| 6,611,441 B2 | 8/2003 | Kurokami et al. | |
| 6,672,018 B2 | 1/2004 | Shingleton | |
| 6,678,174 B2 | 1/2004 | Suzui et al. | |
| 6,690,590 B2 | 2/2004 | Stamenic et al. | |
| 6,738,692 B2 | 5/2004 | Schienbein et al. | |
| 6,768,047 B2 | 7/2004 | Chang et al. | |
| 6,788,033 B2 | 9/2004 | Vinciarelli | |
| 6,795,318 B2 | 9/2004 | Haas et al. | |
| 6,801,442 B2 | 10/2004 | Suzui et al. | |
| 6,914,418 B2 | 7/2005 | Sung | |
| 6,919,714 B2 | 7/2005 | Delepaut | |
| 6,936,995 B2 | 8/2005 | Kapsokavathis et al. | |
| 6,963,147 B2 | 11/2005 | Kurokami et al. | |
| 6,984,970 B2 | 1/2006 | Capel | |
| 7,030,597 B2 | 4/2006 | Bruno et al. | |
| 7,031,176 B2 | 4/2006 | Kotsopoulos et al. | |
| 7,042,195 B2 | 5/2006 | Tsunetsugu et al. | |
| 7,046,531 B2 | 5/2006 | Zocchi et al. | |
| 7,053,506 B2 | 5/2006 | Alonso et al. | |
| 7,072,194 B2 | 7/2006 | Nayar et al. | |
| 7,079,406 B2 | 7/2006 | Kurokami et al. | |
| 7,087,332 B2 | 8/2006 | Harris | |
| 7,090,509 B1 | 8/2006 | Gilliland et al. | |
| 7,091,707 B2 | 8/2006 | Cutler | |
| 7,097,516 B2 | 8/2006 | Werner et al. | |
| 7,126,053 B2 | 10/2006 | Kurokami et al. | |
| 7,126,294 B2 | 10/2006 | Minami et al. | |
| 7,148,669 B2 | 12/2006 | Maksimovic et al. | |
| 7,291,036 B1 | 11/2007 | Daily et al. | |
| 7,385,833 B2 | 6/2008 | Keung | |
| 7,420,815 B2 | 9/2008 | Love | |
| 7,435,134 B2 | 10/2008 | Lenox | |
| 7,435,897 B2 | 10/2008 | Russell | |
| 7,600,349 B2 | 10/2009 | Liebendorfer | |
| 7,748,175 B2 | 7/2010 | Liebendorfer | |
| 7,759,575 B2 | 7/2010 | Jones et al. | |
| 7,763,807 B2 | 7/2010 | Richter | |
| 7,780,472 B2 | 8/2010 | Lenox | |
| 7,960,650 B2 | 6/2011 | Richter et al. | |
| 8,003,885 B2 | 8/2011 | Richter et al. | |
| 2003/0080741 A1 | 5/2003 | LeRow et al. | |
| 2004/0201279 A1 | 10/2004 | Templeton | |
| 2005/0057214 A1 | 3/2005 | Matan | |
| 2005/0057215 A1 | 3/2005 | Matan | |
| 2005/0068820 A1 | 3/2005 | Radosevich et al. | |
| 2005/0172995 A1 | 8/2005 | Rohrig et al. | |
| 2006/0001406 A1 | 1/2006 | Matan | |
| 2006/0038692 A1 | 2/2006 | Schnetker | |
| 2006/0108979 A1 | 5/2006 | Daniel et al. | |
| 2006/0149396 A1 | 7/2006 | Templeton | |
| 2006/0162772 A1 | 7/2006 | Presher, Jr. et al. | |
| 2006/0174939 A1 | 8/2006 | Matan | |
| 2006/0185727 A1 | 8/2006 | Matan | |
| 2006/0192540 A1 | 8/2006 | Balakrishnan et al. | |
| 2006/0208660 A1 | 9/2006 | Shinmura et al. | |
| 2007/0044837 A1 | 3/2007 | Simburger et al. | |
| 2007/0159866 A1 | 7/2007 | Siri | |
| 2008/0097655 A1 | 4/2008 | Hadar et al. | |
| 2008/0136367 A1 | 6/2008 | Adest et al. | |
| 2008/0144294 A1 | 6/2008 | Adest et al. | |
| 2008/0238195 A1 | 10/2008 | Shaver et al. | |
| 2009/0084570 A1 | 4/2009 | Gherardini et al. | |
| 2009/0282755 A1 | 11/2009 | Abbott et al. | |
| 2010/0269430 A1 | 10/2010 | Haddock et al. | |
| 2010/0282290 A1 | 11/2010 | Schwarze et al. | |
| 2010/0294528 A1 | 11/2010 | Sella et al. | |
| 2010/0294903 A1 | 11/2010 | Shmukler et al. | |
| 2011/0114154 A1 | 5/2011 | Lichy et al. | |
| 2011/0271611 A1 | 11/2011 | Maracci et al. | |

FOREIGN PATENT DOCUMENTS

| | | |
|---|---|---|
| EP | 0604777 | 7/1994 |
| EP | 1531545 | 5/2005 |
| EP | 1657797 | 5/2006 |
| ES | 2249147 | 3/2006 |
| JP | 2003134667 | 5/2003 |
| JP | 2007058845 | 3/2007 |
| WO | 9313587 | 7/1993 |
| WO | 9613093 | 5/1996 |
| WO | 9823021 | 5/1998 |
| WO | 03050938 | 6/2003 |
| WO | 03071655 | 8/2003 |
| WO | 2004023278 | 3/2004 |
| WO | 2004090993 | 10/2004 |
| WO | 2004107543 | 12/2004 |
| WO | 2005076445 | 8/2005 |
| WO | 2006078685 | 7/2006 |
| WO | 2007006564 | 1/2007 |
| WO | 2007084196 | 7/2007 |
| WO | 2007113358 | 10/2007 |

OTHER PUBLICATIONS

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Kajihara, et al., "Model of Photovoltaic Cell Circuits Under Partial Shading", 2005 IEEE, pp. 866-870.

Knaupp, et al., "Operation of a 10 KW PV Façade with 100 W AC Photovoltaic Modules", 1996 IEEE, 25th PVSC, May 13-17, 1996, pp. 1235-1238, Washington, DC.

Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.

Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.

Chen, et al., "Predictive Digital Current Programmed Control", IEEE Transactions on Power Electronics, vol. 18, Issue 1, Jan. 2003.

Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.

Alonso, "A New Distributed Converter Interface for PV Panels", 20th European Photovoltaic Solar Energy Conference, Jun. 6-10, 2005, Barcelona, Spain, pp. 2288-2291.

Alonso, "Experimental Results of Intelligent PV Module for Grid-Connected PV Systems", 21st European Photovoltaic Solar Energy Conference, Sep. 4-8, 2006, Dresden, Germany, pp. 2297-2300.

Enslin, "Integrated Photovoltaic Maximum Power Point Tracking Converter", IEEE Transactions on Industrial Electronics, vol. 44, No. 6, Dec. 1997, pp. 769-773.

Lindgren, "Topology for Decentralised Solar Energy Inverters with a Low Voltage AC-Bus", Chalmers University of Technology, Department of Electrical Power Engineering, EPE '99—Lausanne.

Nikraz, "Digital Control of a Voltage Source Inverter in a Photovoltaic Applications", 2004 35th Annual IEEE Power Electronics Specialists Conference, Aachen, Germany, 2004, pp. 3266-3271.

Orduz, "Evaluation Test Results of a New Distributed MPPT Converter", 22nd European Photovoltaic Solar Energy Conference, Sep. 3-7, 2007, Milan, Italy.

Palma, "A Modular Fuel Cell, Modular DC-DC Converter Concept for High Performance and Enhanced Reliability", IEEE 2007, pp. 2633-2638.

Quaschning, "Cost Effectiveness of Shadow Tolerant Photovoltaic Systems", Berlin University of Technology, Institute of Electrical Energy Technology, Renewable Energy Section. EuroSun '96, pp. 819-824.

Roman, "Intelligent PV Module for Grid-Connected PV Systems", IEEE Transactions on Industrial Electronics, vol. 52, No. 4, Aug. 2006, pp. 1066-1073.

Roman, "Power Line Communications in Modular PV Systems", 20th European Photovoltaic Solar Energy Conference, Jun. 6-10, 2005, Barcelona, Spain, pp. 2249-2252.

Uriarte, "Energy Integrated Management System for PV Applications", 20th European Photovoltaic Solar Energy Conference, Jun. 6-10, 2005, Barcelona, Spain, pp. 2292-2295.

Walker, "Cascaded DC-DC Converter Connection of Photovoltaic Modules", IEEE Transactions on Power Electronics, vol. 19, No. 4, Jul. 2004, pp. 1130-1139.

PCT/IB2010/052287 International Search Report and Written Opinion dated Sep. 2, 2010.

* cited by examiner

DUAL COMPRESSIVE CONNECTOR

CROSS REFERENCE TO RELATED APPLICATIONS

The present application benefits from U.S. patent application 61/180,458 filed on May 22, 2009, the disclosure of which is incorporated herein by reference.

BACKGROUND

1. Technical Field

The present invention relates to an electrical connector and specifically to an electrical connector used to connect photovoltaic panels.

2. Description of Related Art

Bus ribbon or bus bar is a common interconnect that is used to connect photovoltaic modules. Bus ribbon is a copper ribbon, or flat wire that may be tin plated or coated in solder. The solder protects the surface of the copper from oxidation and provides a layer of solder to form a solder joint in cases where solder interconnections are used. Bus ribbon is generally of width five to six millimeters, although some applications require bus ribbon to be more than twice as wide. Bus ribbon may serve as an input/output to a conventional photovoltaic junction box typically mounted on the back side of a photovoltaic panel.

U.S. Pat. No. 7,291,036 discloses a photovoltaic connection system including a connection box with for surface mounted diodes mounted on a printed circuit board inside of the connection box.

3. Definitions

The term "cable gland" as used herein refers to a device used for the entry of electrical cables or cords into electrical equipment and is used to firmly secure an electrical cable entering a piece of electrical equipment.

The term "tool" as used herein in the context of the present invention refers a conventional hand tool, e.g. screwdriver, or other element or accessory used for making or breaking electrically connections.

The term "longitudinal" in the context of "a strip of metal" refers to a direction parallel to the longest dimension of the strip. The term "thickness" is the shortest dimension of the strip.

The term "case" and "casing" are used herein interchangeably as the outer component of an electrical connector.

BRIEF SUMMARY

According to an aspect of the present invention there is provided an electrical connector for electrically connecting multiple photovoltaic bus bars. A casing includes first and second opposing walls. An elastic strip is bent into a bent elastic strip with a first leg and a second leg. The bent elastic strip is disposed between the first and second walls of the casing with the first leg pressing against the first wall and the second leg pressing against the second wall. The bent elastic strip is configured to hold at least one of the photovoltaic bus bars between the first leg and the first wall. Another photovoltaic bus bar may be located between the second leg and the second wall. The bent elastic strip may be formed of resilient spring metal with a thickness and an elastic modulus. The thickness and/or the elastic modulus of the elastic strip is/are configured so that the bus bars are inserted without requiring a tool to open a space between the first leg and the first opposing wall or between the second leg and the second opposing wall. The thickness and/or elastic modulus of the elastic strip is/are configured so that the bus bars are removed from the connector without requiring a tool to break the electrical connection. A protrusion in at least one of the legs is configured to be inserted into a corresponding hole in the casing. One or both of the legs of the bent elastic strip may be slotted longitudinally over a portion thereof to form a third leg. The third leg is configured to hold yet another bus bar to one of the opposing walls. The first, second and third legs are individually connectible to said casing by individually inserting the bus bars without releasing any connected bus bars.

According to an aspect of the present invention there is provided an electrical connector for electrically connecting multiple photovoltaic bus bars. A casing includes first and second opposing walls. Multiple bent elastic strips each have a first leg and a second leg. The bent elastic strips are disposed between the first and second opposing walls of the casing The first leg of a first of the bent elastic strips presses against the first opposing wall and the second leg of a last bent elastic strip presses against the second opposing wall and intermediary first and second legs of adjacent bent elastic strips press on each other. The bent elastic strips are adapted for holding at least one of the photovoltaic bus bars between the intermediary first and second legs and for holding another photovoltaic bus bar between the first leg of the first of the elastic strips and the first opposing wall and/or between the second leg of the last bent elastic strip and the second opposing wall. The bent elastic strips are formed of resilient spring metal with a thickness and an elastic modulus. The thickness and/or the elastic modulus of the bent elastic strips is/are configured so that the bus bars are inserted by poking without requiring a tool to open a space between the intermediary legs, between the first leg of the first of the elastic strips and the first opposing wall or between the second leg of the last bent elastic strip and the second opposing wall. Similarly, a tool is not required to break the electrical connection which is performed only by pulling from the bus bar from the casing and bent elastic strip.

According to an aspect of the present invention there is provided a method for producing an electrical connection of multiple photovoltaic bus bars. A bent elastic strip is inserted between first and second opposing walls of a casing with the first leg pressing against the first opposing wall and the second leg pressing against the second opposing wall. The bus bars are electrically connected by individually poking the bus bars between the legs and walls, thereby producing electrically connected photovoltaic bus bars. The electrical connection is performed by the poking without requiring a tool to open a space between the legs and the walls. Electrical disconnection of one of the photovoltaic bus bars is performed by pulling on the one photovoltaic bus bar and without releasing thereby any of the electrically connected photovoltaic bus bars and without requiring an external tool or action of another connector component. Prior to insertion of the bus bars, the casing having the first and second opposing walls may be formed by folding sheet metal. A strip of resilient spring metal with a thickness and an elastic modulus is bent to form a bent elastic strip. The bent elastic strip has the first leg and the second leg.

These, additional, and/or other aspects and/or advantages of the present invention are: set forth in the detailed description which follows; possibly inferable from the detailed description; and/or learnable by practice of the present invention.

BRIEF DESCRIPTION OF THE DRAWINGS

Aspects of the present invention is herein described, by way of example only, with reference to the accompanying drawings, wherein:

FIG. 1b shows a cross section, of the connector of FIG. 1a.

The foregoing and/or other aspects will become apparent from the following detailed description when considered in conjunction with the accompanying drawing figures.

DETAILED DESCRIPTION

Reference will now be made in detail to embodiments of the present invention, examples of which are illustrated in the accompanying drawings, wherein like reference numerals refer to the like elements throughout. The embodiments are described below to explain the present invention by referring to the figures.

Figure 1A:
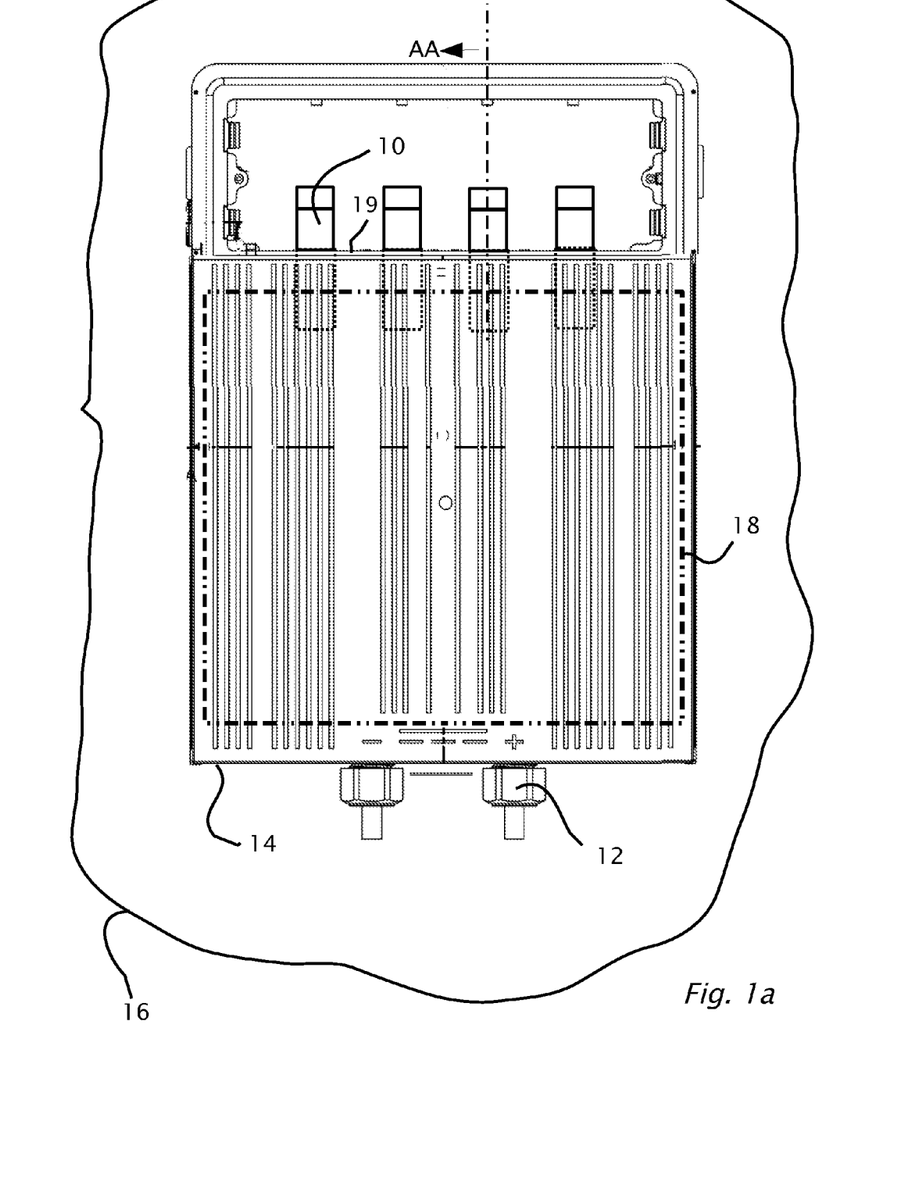
FIG. 1a shows a plan view of a junction box mounted on the non-photovoltaic side of a photovoltaic panel with connectors according to an embodiment of the present invention.
Figure 1B:
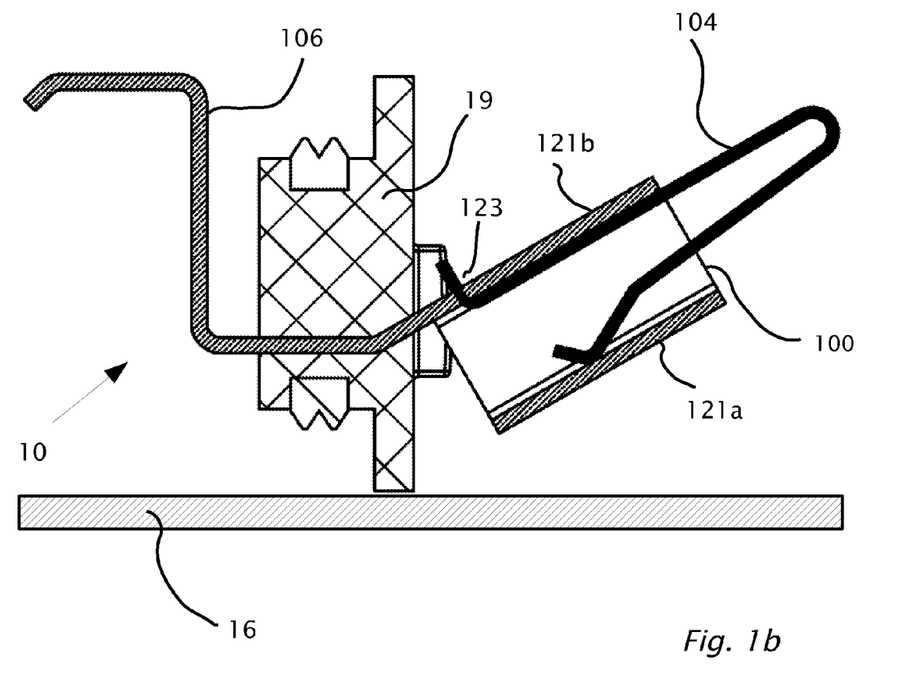
Figure 2:
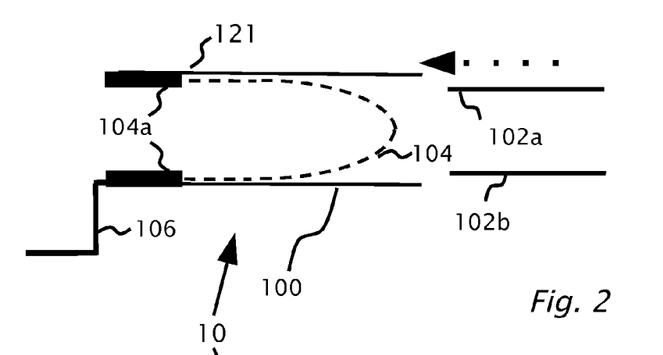
FIG. 2 and FIG. 3 show a side cross sectional view and a plan view respectively of an electrical connector, according to another embodiment of the present invention.
Figure 3:
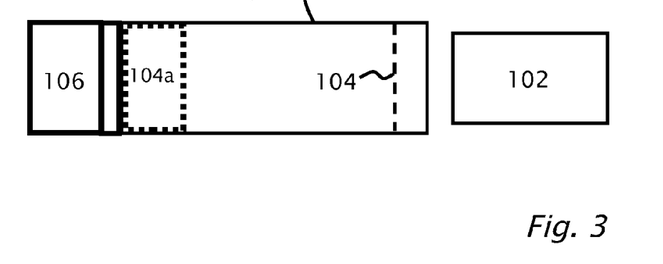

Reference is now made to FIG. 1a which shows a plan view of a junction box 14 mounted on the non-photovoltaic side of a photovoltaic panel 16. One example of junction box 14 is more fully described in a co-pending US patent application entitled "Electrically isolated heat dissipating junction box" of the present inventors, though other types of junction boxes may be used. Cable glands 12 allow insertion and holding of cables which are typically terminated on a circuit board 18 or connectors 10, constructed in accordance with features of the present invention. Four identical connectors are shown in FIG. 1a but only one connector is labeled with a reference number 10. Connectors 10 are mounted on a wall 19. Circuit board 18 may typically include a direct current (DC) to alternating current (AC) inverter or a DC to DC converter. Circuit board 18 connects electrically and mechanically to one end of connectors 10. The other end of connectors 10 typically receives electrical connections, e.g bus bars from photovoltaic panel 16 and optionally from other photovoltaic panels, connected in series and/or in parallel with photovoltaic panel 16. Reference is now also made to FIG. 1b which shows a cross section, at dotted line AA of FIG. 1a of connector 10, according to an embodiment of the present invention. Wall 19 which secures connector 10 is shown in cross section as is non-photovoltaic side of photovoltaic panel 16. Connector includes two components a casing 100 and a bent elastic strip 104. Elastic strip 104 is bent to have two legs each of which press on opposite walls 121a and 121b. One of the legs of elastic strip 104 is shown to have a protrusion which extends through a corresponding hole 123 in casing 100 to secure elastic strip 104 to casing 100. Electrical connection to connector 10 is made to electrical fixture 106 an extension to casing 100 which extends through wall 19. Reference is now made to FIG. 2 and FIG. 3 which show a side cross sectional view and a plan view respectively of an electrical connector 10, according to another embodiment of the present invention with electrical connection thereof using multiple bus bars 102. Case 100 of rectangular cross section is shown with at least one open end. Although case 100 is shown to have the shape of a right rectangular prism, case 100 may also in other embodiments be designed as an oblique prism, a section of a square pyramid and other three dimensional shapes. Elastic strip 104, which may be electrically conductive, is attached inside rectangular case 100. Elastic strip 104 is attached to rectangular case 100 at one or both legs 104a for example using a spot weld, silver solder, mechanical or other means of connection, so that bus bar 102 and rectangular case 100 are attached together mechanically and are electrically conductive with elastic strip 104 holding the connection together. An electrical connection is made by insertion of bus bar 102 into the space between the wall of rectangular case 100 and elastic strip 104 in the direction of the dotted arrow shown. Bus bar 102 is held in place by virtue of the pressure elastic strip 104 exerts on rectangular case 100. Electrical conductivity between bus bar 102 and case 100 is achieved by one side of bus bar 102 pressing against rectangular case 100 and the other side of bus bar 102 pressing against elastic strip 104. A feature of the present invention is that bus bar 102a and bus bar 102b can be both inserted into electrical connector 10 allowing for more options when connecting multiple electrical connectors 10 in various serial and parallel connections of circuits attached between bus bar 106 and inserts 102. According to a feature of the present invention, the mechanical properties, elastic modulus and/or thickness of elastic strip 104 are designed so that the elasticity of elastic strip 104 is sufficiently weak so that bus bars 102 may be poked between legs 104a and respective walls 121 of casing 100 without requiring an external tool or another connector component and without deforming bus bar 102 on insertion. Elasticity of elastic strip 104 is sufficiently strong, however, to maintain a reliable physical and mechanical connection between bus bar 102 and casing 100 and/or elastic strip 104. A tool is not required to assist in making a space for bus bar 102 nor to break the connection.

Figures 4A, 4B:
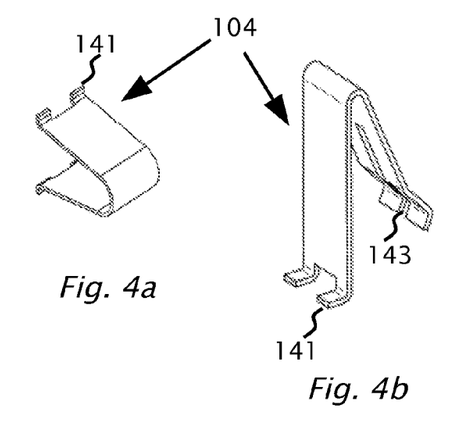
FIGS. 4a and 4b which illustrate further details of an elastic strip with additional features according to the present invention.
Figure 4C:
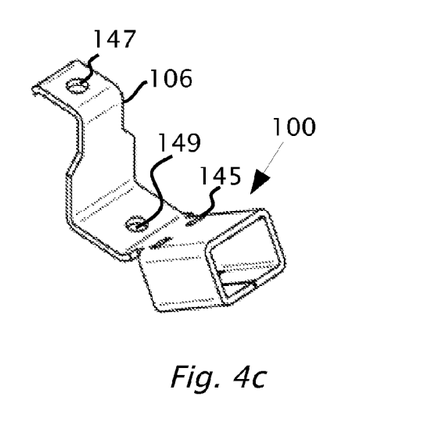
FIG. 4c illustrates further details of a casing, according to further aspects of the present invention.
Figure 5:
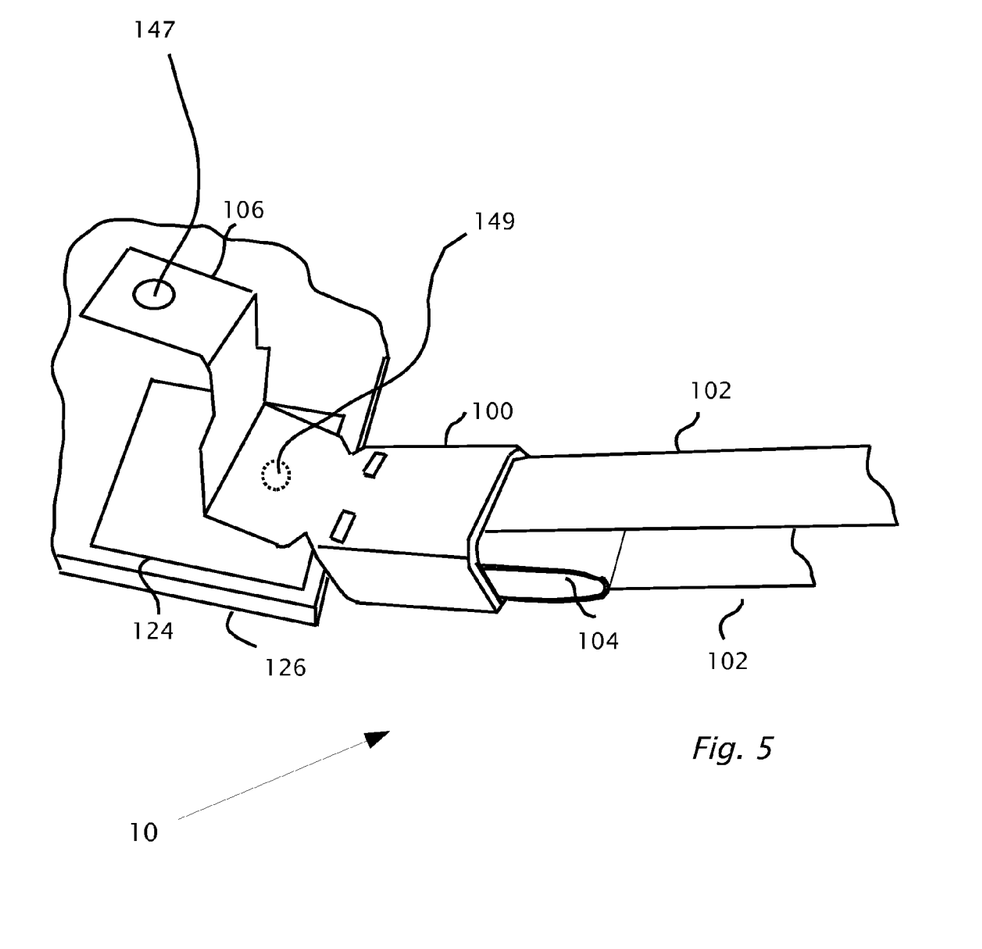
FIG. 5 is an isometric drawing which illustrates an assembled connector with two bus bars, according to another embodiment of the present invention.
Figure 6:
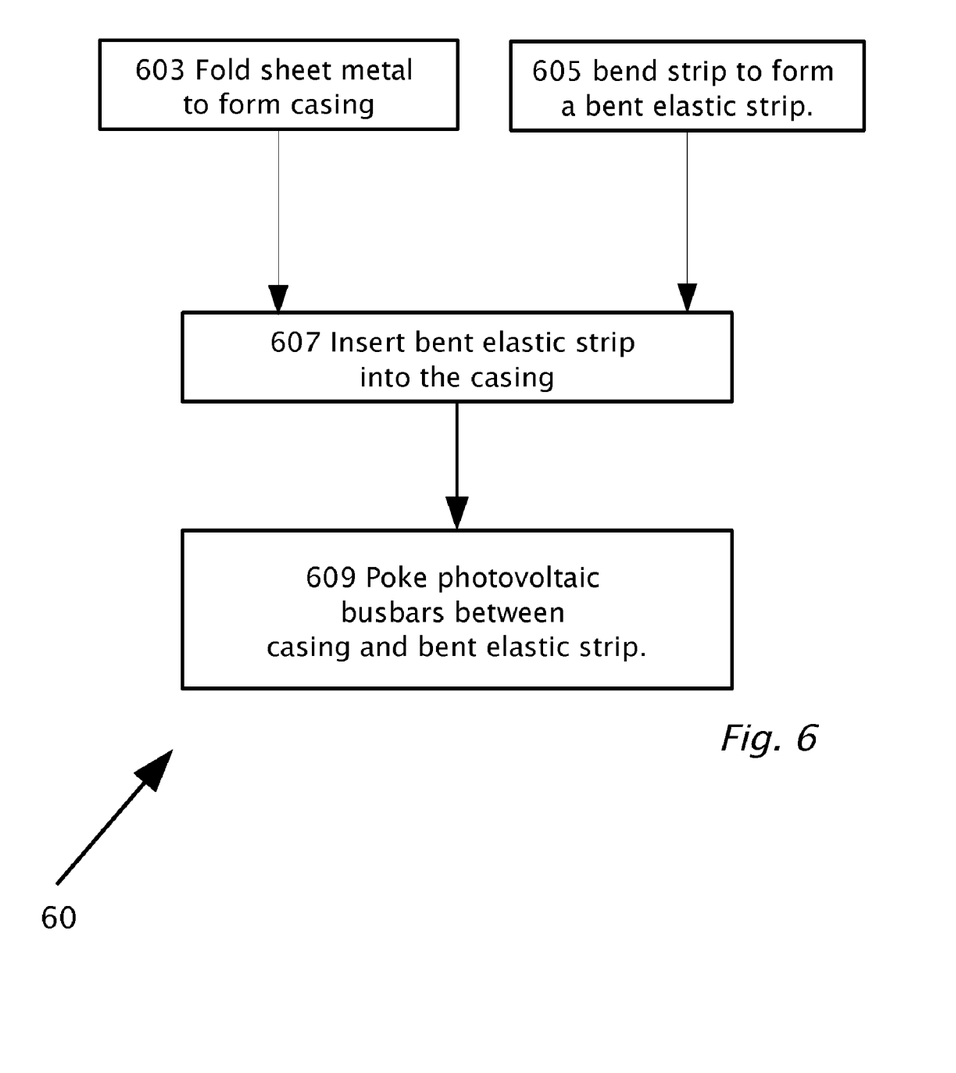
FIG. 6 illustrates a process of connecting photovoltaic bus bars, according to yet another embodiment of the present invention.

Reference is now made to FIGS. 4a and 4b which illustrate further details of elastic strip 104 with different features according to the present invention. In FIG. 4a, elastic strip 104 is symmetric with four protrusions 141 adapted to fit into corresponding holes of and attach to casing 100. In FIG. 4b, elastic strip 104 is asymmetric with protrusions 141 in one leg only adapted to fit into one wall 121 of casing 100. The opposite leg of elastic strip 104 may include one or more slots 143 so that elastic spring effectively may have three legs 104a, with slot 143 dividing one leg 104a into two legs on one side. There are several advantages to slot 143 in elastic strip 104 of FIG. 4b. A redundant pressure point against wall 121 is provided and the reliability of the electrical connection to bus bar 102 is increased. Another advantage is that a third bus bar 102 may be connected independently against the same wall 121 without releasing bus bar 102 already connected on the same wall 121. Finally, slot 143 reduces the parallelism tolerance of opposing walls 121 of casing 100 since two legs divided by slot 143 are decoupled mechanically. Elastic strip 104 may be manufactured from conductive resilient spring metal such as a copper alloy, e.g. beryllium copper or stainless steel. Wall thickness of stainless steel elastic strip is typically one to two millimeters. Reference is now made to FIG. 4c which illustrates further details of casing 100, according to further aspects of the present invention. Holes or slots 145 correspond to protrusions 141 for attaching elastic strip 104 when inserted into casing 100. A solder hole 147 and a molding hole 149 in electrical fixture 106 are available for making electrical connections to one or two circuit boards. Solder hole 147, molding hole 149 and slots 145 for attaching elastic strip 104 are punched or drilled. It is readily seen that casing 100 as shown in the example of FIG. 4c may be manufactured by folding sheet metal. Casing 100 may be manufactured from a copper alloy such as brass with an optional coating of nickel for example. The coating material may be selected to minimize galvanic corrosion between the different metals. Reference is now also made to FIG. 5, an isometric drawing which illustrates an assembled connector 10. Electrical fixture 106 is shown soldered to a solder pad 124 on a circuit board 126 through hole 149. Two bus bars 102 are inserted between elastic strip 104 and two opposing walls of casing 100. In an alternate construction, solder pad 124 may be soldered to electrical fixture 106 through hole 147. Reference is now also made to FIG. 6 which illustrates a process of connecting photovoltaic bus bars 102, according to an embodiment of the present invention. In step 603, a casing 100 is formed from folding sheet metal, casting or any other manufacturing process. Elastic strip is manufactured and elastically bent (step 605). Bent elastic strip is inserted (step 607) into casing 100. Attachment is achieved by pushing protrusions 141 through corresponding holes 145, by soldering, spot welding, or any other means of connection. Electrical connection to bus bars 102 is achieved by poking bus bars between respective walls 121 of casing 100 and elastic strip 104 (step 609). According to a feature of the present invention, a tool or another component is not required to make a space between bus bar 102 and wall 121 of casing 100 nor to release bus bar 102.

Figure 7:
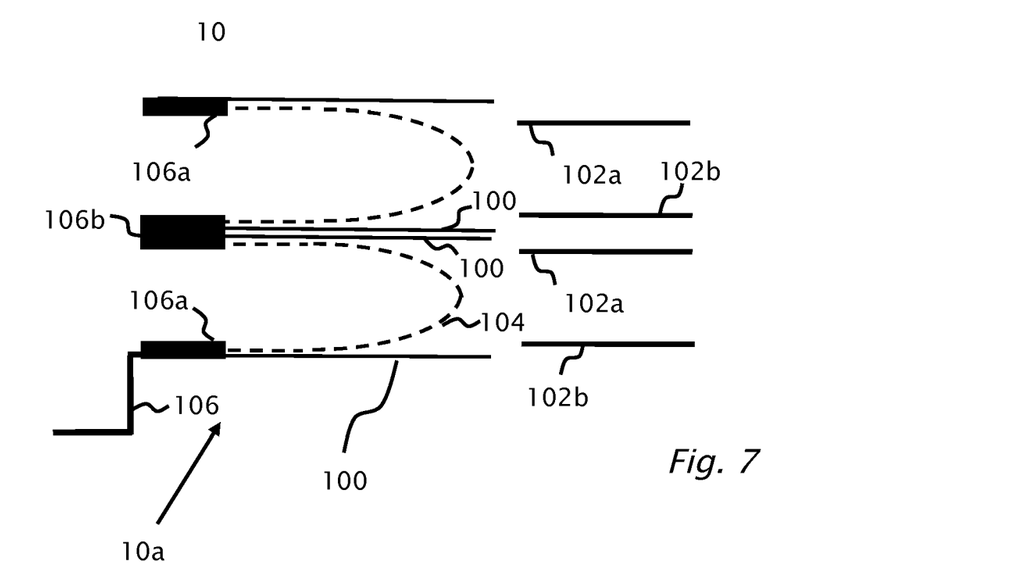
FIG. 7 shows a side cross sectional view of an electrical connector according to another embodiment of the present invention.

FIG. 7 shows a side-cross-sectional view of an electrical connector 10a according to another embodiment of the present invention. Electrical connector 10a is effectively two electrical connectors 10 stacked on top of each other and attached mechanically and electrically together via legs 106b. This embodiment of the present invention allows for multiple, e.g. four bus bars 102 (2×102a+2×102b) to be inserted into electrical connector 10a. A number of electrical connectors 10 may be stacked and attached together (mechanically and/or electrically) both horizontally and vertically in various combinations.

Figure 8:
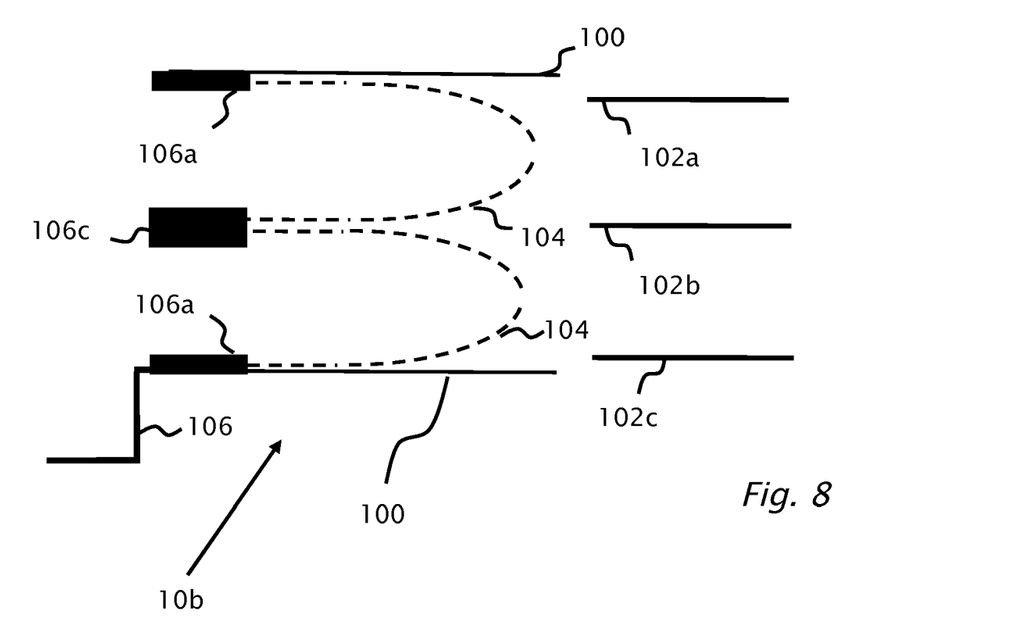
FIG. 8 shows a side cross sectional view of an electrical connector according to yet another embodiment of the present invention.

FIG. 8 shows a side cross sectional view of an electrical connector 10b according to yet another embodiment of the present invention. A rectangular case 100 made for instance from an electrically conductive material, has two elastic strips 104 attached inside rectangular case 100. Elastic strips 104 are attached together at legs 106c and to rectangular case 100 (for example using a weld or solder), so that bus bar 106, elastic strips 104 and rectangular case 100 are attached together mechanically and are electrically conductive. An electrical connection for example is made by insertion of bus bar 102a between the space between the wall of rectangular case 100 and elastic strip 104. Bus bar 102a is held in place by virtue of the elastic compression that exists between rectangular case 100 and elastic strip 104. Electrical conductivity between bus bar 102a and bus bar 106 is achieved by one side of bus bar 102a pressing against rectangular case 100 and the other side of bus bar 102a pressing against elastic strip 104. Another electrical connection can be made by inserting bus bar 102b between the two elastic strips 104. A feature of the present invention is that bus bars 102a, 102b and bus bar 102c can be inserted into electrical connector 10b at the same time allowing for more options when connecting multiple electrical connectors 10b in various serial and parallel connections of circuits attached between bus bar 106 and bus bar 102a, 102b and bus bar 102b for example.

The definite articles "a", "an" is used herein, such as "a casing", "an elastic strip" have the meaning of "one or more" that is "one or more casings" or "one or more elastic strips".

Examples of various features/aspects/components/operations have been provided to facilitate understanding of the disclosed embodiments of the present invention. In addition, various preferences have been discussed to facilitate understanding of the disclosed embodiments of the present invention. It is to be understood that all examples and preferences disclosed herein are intended to be non-limiting.

Although selected embodiments of the present invention have been shown and described individually, it is to be understood that at least aspects of the described embodiments may be combined.

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

We claim:

1. An electrical connector for electrically connecting a plurality of photovoltaic bus bars, the electrical connector comprising:
    a casing including first and second opposing walls; and
    a bent elastic strip including a first leg and a second leg,
    wherein said bent elastic strip is disposed between said first and second walls of said casing with said first leg pressing against said first wall and said second leg pressing against said second wall,
    wherein said bent plastic elastic strip is configured to hold a first photovoltaic bus bar between said first leg and said first wall, and to hold a second photovoltaic bus bar between said second leg and said second wall;
    wherein a portion of the second leg is slotted longitudinally to form a third leg,
    wherein said third leg is configured to hold a third bus bar between the third leg and the second wall,
    wherein the electrical connector is configured to individually connect said first bus bar, said second bus bar, and said third bus bar to said casing by individually receiving one or more of the first bus bar, the second bus bar, and the third bus bar without releasing any connected bus bars.

2. The electrical connector of claim 1, wherein said bent elastic strip is formed of resilient spring metal comprising a thickness and an elastic modulus, wherein one or both of said thickness and the elastic modulus are configured to allow insertion of one or more of the first bus bar, the second bus bar, and the third bus bar without requiring a tool to open a space between one or more of said first leg and said first wall, said second leg and said second wall, and the third leg and the second wall.

3. The electrical connector of claim 1, wherein said bent elastic strip is formed of resilient spring metal comprising a thickness and an elastic modulus, wherein one or both of said thickness and elastic modulus are configured to allow removal of one or more of the first bus bar, the second bus bar, and the third bus bar from the electrical connector without requiring a tool.

4. The electrical connector of claim 1, wherein the casing comprises one or more holes, and wherein one or more of the first leg, the second leg, and the third leg comprise a respective protrusion configured to be respectively inserted into a respective one of the one or more holes.

5. The electrical connector of claim 1, wherein said first bus bar and said second bus bar are held longitudinally from the same direction.

6. The electrical connector of claim 1, wherein said bent elastic strip includes a single bend.

7. An electrical connector for electrically connecting a plurality of photovoltaic bus bars, the electrical connector comprising:
   a casing including first and second opposing walls; and
   a plurality of bent elastic strips each having a first leg and a second leg, wherein said bent elastic strips are disposed between said first and second opposing walls of said casing with said first leg of a first of said bent elastic strips pressing against said first opposing wall and said second leg of a last bent elastic strip pressing against said second opposing wall and intermediary first and second legs of adjacent ones of the bent elastic strips pressing on each other,
   wherein said bent elastic strips are adapted for holding at least one of the photovoltaic bus bars between said intermediary first said second legs and for holding another at least one of the photovoltaic bus bars between said first leg of the first of said elastic strips and said first opposing wall or between said second leg of the last bent elastic strip and said second opposing wall.

8. The electrical connector of claim 7, wherein said bent elastic strips are formed of resilient spring metal respectively comprising a respective thickness and a respective elastic modulus, wherein at least one of said respective thickness and said respective elastic modulus of said bent elastic strips are configured to allow insertion of said bus bars without requiring a tool to open a space between one or more of said intermediary legs, between said first leg of the first of said elastic strips and said first opposing wall, and between said second leg of the last bent elastic strip and said second wall.

9. The electrical connector of claim 7, wherein said bent elastic strips are formed of resilient spring metal respectively comprising a respective thickness and a respective elastic modulus, wherein at least one of said respective thickness and said respective elastic modulus of said bent elastic strips are configured such that a tool is not required to break a respective electrical connection between one of the photovoltaic bus bars and the connector, wherein breaking the respective electrical connection comprises respectively pulling on the one bus bar to release the one bus bar from said electrical connector.

10. An apparatus comprising:
   a casing including first and second opposing walls; and
   an elastic strip including a first leg pressing against the first wall, a second leg pressing against the second wall, and a third leg pressing against the second wall, and configured to hold a first photovoltaic bus bar between the first leg and said first wall, to hold a second photovoltaic bus bar between the second leg and the second wall, and to hold a third photovoltaic bus bar between the third leg and the second wall;
   said apparatus configured to individually connect said first bus bar, said second bus bar, and said third bus bar to said casing by receiving one or more of the first bus bar, the second bus bar, or the third bus bar without releasing connected bus bars.

* * * * *